US012800709B2

(12) United States Patent
Goessler et al.

(10) Patent No.: US 12,800,709 B2
(45) Date of Patent: Nov. 17, 2026

(54) COMPONENT CARRIER WITH EMBEDDED HIGH-FREQUENCY COMPONENT AND INTEGRATED WAVEGUIDE FOR WIRELESS COMMUNICATION

(71) Applicant: AT&S Austria Technologie & Systemtechnik Aktiengesellschaft, Leoben (AT)

(72) Inventors: Michael Goessler, Kobenz (AT); Sebastian Sattler, Graz (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 378 days.

(21) Appl. No.: 17/654,658

(22) Filed: Mar. 14, 2022

(65) Prior Publication Data

US 2022/0299595 A1 Sep. 22, 2022

(30) Foreign Application Priority Data

Mar. 17, 2021 (EP) .................................... 21163032

(51) Int. Cl.
*G01S 7/03* (2006.01)
*G01S 7/02* (2006.01)
(Continued)

(52) U.S. Cl.
CPC .............. *G01S 7/032* (2013.01); *G01S 7/028* (2021.05); *H05K 1/0274* (2013.01);
(Continued)

(58) Field of Classification Search
CPC ....... G01S 7/032; G01S 7/028; H05K 1/0274; H05K 1/0298; H05K 1/115;
(Continued)

(56) References Cited

U.S. PATENT DOCUMENTS

2007/0205847 A1* 9/2007 Kushta ................ H05K 1/0222 174/266
2012/0062346 A1* 3/2012 McKinzie, III ......... H01P 1/163 29/829

(Continued)

FOREIGN PATENT DOCUMENTS

CN 202652709 U 1/2013
WO 2014203235 A1 12/2014
WO 2014203325 A1 12/2014

OTHER PUBLICATIONS

Culhaoglu, A.; European Search Report in Application No. 21163032.2; pp. 1-11; Sep. 1, 2021; European Patent Office; 80298 Munich, Germany.

*Primary Examiner* — Samarina Makhdoom
(74) *Attorney, Agent, or Firm* — Robert A. Blaha; Smith Tempel Blaha LLC

(57) ABSTRACT

A component carrier which includes a stack with at least one electrically conductive layer structure and/or at least one electrically insulating layer structure, a high-frequency component embedded in the stack. At least one waveguide is integrated in the stack. A transmission line and a coupling element configured transmit a signal between the high-frequency component and the at least one waveguide. A transmission and/or reception unit wirelessly transmits and/or receives one or more signals.

17 Claims, 2 Drawing Sheets

(51) Int. Cl.
*H05K 1/02* (2006.01)
*H05K 1/11* (2006.01)

(52) U.S. Cl.
CPC ........... *H05K 1/0298* (2013.01); *H05K 1/115* (2013.01); *H05K 2201/096* (2013.01); *H05K 2201/09618* (2013.01); *H05K 2201/10098* (2013.01); *H05K 2201/10121* (2013.01)

(58) Field of Classification Search
CPC ... H05K 2201/096; H05K 2201/09618; H05K 2201/10098; H05K 2201/10121
USPC .......................................................... 342/175
See application file for complete search history.

(56) References Cited

U.S. PATENT DOCUMENTS

| | | | | |
|---|---|---|---|---|
| 2013/0127562 | A1 | 5/2013 | Purden et al. | |
| 2014/0184359 | A1* | 7/2014 | Iida | H01P 3/082 333/238 |
| 2014/0240187 | A1* | 8/2014 | Herbsommer | H05K 1/024 343/785 |
| 2015/0015453 | A1* | 1/2015 | Puzella | H05K 1/0206 333/1.1 |
| 2015/0349398 | A1* | 12/2015 | Uemichi | H01P 5/107 29/600 |
| 2016/0126637 | A1 | 5/2016 | Jemichi | |
| 2016/0276727 | A1* | 9/2016 | Dang | H01P 3/08 |
| 2017/0213800 | A1* | 7/2017 | Seler | H01L 23/3114 |
| 2018/0108968 | A1 | 4/2018 | Purden et al. | |
| 2018/0115042 | A1* | 4/2018 | Connor | H05K 1/0243 |
| 2018/0288879 | A1* | 10/2018 | Tuominen | H05K 3/4697 |
| 2018/0309207 | A1* | 10/2018 | Kirino | H01P 3/00 |
| 2019/0081376 | A1* | 3/2019 | Takeda | H01P 3/14 |
| 2019/0101636 | A1 | 4/2019 | Trotta et al. | |
| 2019/0288371 | A1 | 9/2019 | Kamgaing et al. | |
| 2019/0378801 | A1* | 12/2019 | Leitgeb | H01Q 1/526 |
| 2020/0014119 | A1 | 1/2020 | Kim et al. | |
| 2020/0067198 | A1* | 2/2020 | Hunziker | H01L 24/19 |
| 2020/0303799 | A1* | 9/2020 | Wang | H05K 1/0222 |
| 2021/0013182 | A1* | 1/2021 | Reitmaier | H05K 3/4697 |

* cited by examiner

COMPONENT CARRIER WITH EMBEDDED HIGH-FREQUENCY COMPONENT AND INTEGRATED WAVEGUIDE FOR WIRELESS COMMUNICATION

CROSS-REFERENCE TO RELATED APPLICATIONS

The present application claims priority to and the benefit of the filing date of European Patent Application No. 21163032.2, filed Mar. 17, 2021, the disclosure of which is hereby incorporated herein by reference.

TECHNICAL FIELD

The disclosure relates to a component carrier, to an electronic device, and to a method of manufacturing a component carrier.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically reliable so as to be operable even under harsh conditions.

Moreover, the transmission of high-frequency signals propagating along wiring structures of a component carrier and between component carrier and a communication partner device may be challenging. On the one hand, transmission artefacts such as passive intermodulation can substantially degrade the overall performance of a component carrier with high-frequency functionality, etc. At the same time, providing high-frequency functionality using component carriers such as printed circuit boards with one or more surface mounted high-frequency components may involve long signal paths, which may introduce undesired phenomena such as deterioration of signal quality. Moreover, conventional high-frequency devices on the basis of printed circuit boards may require relatively large space.

SUMMARY

There may be a need to enable high performance and high signal quality in terms of high-frequency signal transmission.

In order to achieve the object defined above, a component carrier, an electronic device, and a method of manufacturing a component carrier according to the independent claims are provided.

According to an exemplary embodiment, a component carrier is provided which comprises a (in particular laminated) stack comprising at least one electrically conductive layer structure (in particular a plurality of electrically conductive layer structures) and/or at least one electrically insulating layer structure (in particular a plurality of electrically insulating layer structures), a high-frequency component (in particular a plurality of high-frequency components) embedded in the stack, at least one waveguide (for instance a pair of mutually coupled waveguides) integrated (or embedded) in the stack, a transmission line and a coupling element configured for transmitting a signal between the high-frequency component and the at least one waveguide, and a transmission and/or reception unit (which may be coupled with the at least one waveguide for signal transmission) configured for wirelessly transmitting and/or receiving a signal (in particular with respect to a communication partner device apart from the component carrier).

According to another exemplary embodiment, an electronic device is provided, wherein the electronic device comprises a component carrier having the above-mentioned features.

According to still another exemplary embodiment, a method of manufacturing a component carrier is provided, wherein the method comprises providing a stack comprising at least one electrically conductive layer structure and/or at least one electrically insulating layer structure, embed-ding a high-frequency component in the stack, integrating at least one waveguide in the stack, forming a transmission line and a coupling element for transmitting a signal between the high-frequency component and the at least one waveguide, and forming a transmission and/or reception unit for wirelessly transmitting and/or receiving a signal.

Overview of Embodiments

According to yet another exemplary embodiment, a component carrier having the above-mentioned features is used for a high-frequency application, in particular for conducting a radio frequency (RF) signal, in particular a radio frequency signal with a frequency above 1 GHz.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "stack" may particularly denote an arrangement of multiple planar layer structures which are mounted in parallel on top of one another.

In the context of the present application, the term "layer structure" may particularly denote a continuous layer, a patterned layer or a plurality of non-consecutive islands within a common plane.

In the context of the present application, the term "high-frequency component" may particularly denote an electronic component configured for fulfilled a task which may relate to the processing and/or communication of a radio-frequency signal. Such a radio or high-frequency signal may be an electric or electromagnetic signal propagating along a wiring structure of the component carrier in a range of frequencies used for communications or other signals. In particular, a radio-frequency (RF) signal may for example have a frequency in the range between 3 kHz and 300 GHz, in particular in a range from 60 GHz to 150 GHz. A high-frequency component may have integrated functionality in terms of high-frequency signal generation and/or high-frequency signal processing and/or high-frequency signal transmission. For example, a high-frequency component may be a semiconductor chip (such as an RFIC, radio-frequency integrated circuit) configured for operating with high-frequency signals. For instance, the high-frequency component may provide front end functionality for carrying out front-end processing tasks of a high-frequency application, in particular a communications application. In particular, such a front-end chip may include at least one filter (for instance a high pass filter, a low pass filter and/or a bandpass filter), a mixer for mixing signals and/or an ADC (analog-digital-converter). Thus, the front-end chip may process a front-end signal for example in the analog domain. Additionally or alternatively, it is possible that a high-frequency component functions for impedance matching to ensure a matching of impedances of the front end chip and of a coupling element. Additionally or alternatively, other functions of a high-frequency component are possible.

In the context of the present application, the term "embedded component" may particularly denote a component which is at least partially surrounded by stack material. In particular, at least part of sidewalls of the components may be covered with stack material. For example, a bottom surface and the entire sidewalls of the component may be covered with and embedded in stack material. Additionally, also a top surface of the component may be covered with and embedded in stack material. In particular, embedding the component may result in a component being completely buried within stack material. However, embedding the component in the stack may also be accomplished by inserting the component in a cavity in the stack so that the component still has surface contact, i.e., extends up to a surface of the stack but has sidewalls covered with stack material.

In the context of the present application, the term "waveguide" may particularly denote a structure that guides waves, such as electromagnetic waves, with reduced loss of energy by restricting the transmission of energy to a limited number of directions, in particular, to one direction. Without the physical constraint of a waveguide, wave amplitudes decrease more quickly as they expand into the three-dimensional space. For instance, a waveguide may be a (for instance hollow or dielectrically filled) conductive recess or cavity in a layer stack of a component carrier which may be used to carry high-frequency radio waves. For instance, a cross-section of a metallized recess functioning as waveguide may be rectangular or circular. For instance, a signal may be coupled with a waveguide using a stripline, i.e., a transverse electromagnetic transmission line such as a planar transmission line. In particular, a signal may be coupled between waveguide and stripline at a waveguide-to-stripline transition. A waveguide may be hollow, for instance may be filled with air, or may be filled with a (preferably dielectric) material, such as a low DF material and/or a low DK material. Shape and dimensions of a waveguide may be adjusted in accordance with a signal frequency. Moreover, a waveguide may be adapted in order to fulfill a resonance condition for a signal.

In the context of the present application, the term "transmission line" may particularly denote an electrically conductive connection formed on and/or in the stack and being configured for conducting an electric or electromagnetic signal between coupling element and high-frequency component. In particular, such a transmission line may be an electrically conductive trace which may extend for instance horizontally along a main surface of the component carrier or the stack. For instance, such a transmission line may be a microstrip or a feeding line.

In the context of the present application, the term "coupling element" may particularly denote a structure configured for coupling electric and/or electromagnetic signals between the transmission line (connected to the high-frequency component) and the at least one waveguide. In particular, the coupling element may be a coupling antenna. A coupling antenna, such as an antenna structure, may particularly denote an electrically conductive structure shaped, dimensioned and configured to be capable of receiving and/or transmitting electromagnetic radiation signals corresponding to electric or electromagnetic signals which may be conducted along the transmission line and/or via the waveguide of the component carrier. By such a coupling element integrated in the stack and/or formed on the stack, a signal may be coupled between the at least one waveguide and the transmission line. For example, such an antenna may be formed by patterning a metal layer on top of the stack.

In the context of the present application, the term "transmission and/or reception unit" may particularly denote a transmitter, a receiver or a transceiver (i.e., a combined transmitter and receiver) which may be configured for transmitting and/or receiving an electromagnetic signal, in particular a high-frequency signal. In particular, the transmission and/or reception unit may comprise or consist of an RF (radio-frequency) antenna. For instance, such a transmission and/or reception unit may comprise a transmission and/or reception antenna for carrying out the mentioned task. For example, such a transmission and/or reception unit may be arranged at a main surface of the component carrier or of the stack. Preferably, said main surface opposes another main surface of the component carrier or the stack at which the coupling element cooperating with the transmission line may be arranged. For instance, the transmission and/or reception unit may operate in accordance with a 3RX, a 4RX, a 1TX, a 2TX configuration, etc.

According to an exemplary embodiment, a self-packaged component carrier is provided (which may be embodied for example as a printed circuit board, PCB) which has at least one embedded high-frequency component for fulfilling a high-frequency task in a highly compact way. Further advantageously, such an embedded high-frequency component may be functionally coupled with a waveguide which may be formed in or embedded in the same stack as the component carrier, i.e., spatially close, which contributes additionally to the pronounced compactness of the component carrier. A transmission line and a functionally connected coupling element may accomplish a connection between embedded high-frequency component(s) and stack-internal waveguide along a short signal path. Preferably, said short signal path may extend horizontally along a main surface of the stack or component carrier. This may further promote the compact design of the component carrier and ensures a short signal path, which allows for low ohmic and RF losses and an excellent signal quality. Moreover, the waveguide may be coupled through the stack with a transmission and/or reception unit to keep the dimensions of the component carrier remarkably small. Preferably, the coupling path between waveguide(s) and transmission and/or reception unit may extend at least partially along and/or inside of an opposing other main surface of the stack or component carrier. Also with such a coupling logic, a compact configuration and a low RF loss property of the component carrier may be supported. Hence, a component carrier with high-frequency functionality may be provided with low space consumption and excellent signal quality. Thus, an RF component carrier with high electric performance may be obtained. Furthermore, the component carrier has an advantageous mechanical performance, since the tiny and sensitive at least one high-frequency component may be reliably protected inside of the stack.

In the following, further exemplary embodiments of the component carrier, the electronic device and the method will be explained.

A gist of an exemplary embodiment is based on the transmission, by an embedded high-frequency component and through at least one via, of a signal to a coupling element which sends out a signal into a first waveguide. This first waveguide, which is embedded as well in the stack, transmits the signal via a coupling gap into a second waveguide, which is embedded as well in the stack. From the second waveguide, the signal may propagate to an exterior position of the component carrier via a (for instance strip-shaped) transmission and/or reception unit for transmission to the environment of the (for instance PCB-type) component carrier. An inverse signal path, i.e., for reception rather than transmission of a signal by the component carrier, may be supported as well, additionally or alternatively.

In an embodiment, the stack comprises three interconnected cores. Hence, three separate PCB cores may be processed for embedding or integrating the constituents of the component carrier therein. Thereafter, the cores may be interconnected, for instance by lamination, to form a single component carrier. For example, the at least one high-frequency component may be embedded in a first core, and the transmission line and the coupling element may be formed on the first core. Furthermore, a first waveguide may be embedded in a second core. Beyond this, a second waveguide may be embedded in a third core, and the transmission and/or reception unit may be formed on the third core. The three cores may then be connected with each other, for instance by lamination using a respective at least partially uncured electrically insulating layer structure (such as a prepreg layer or even a high-frequency dielectric) in between each pair of adjacent cores.

In an embodiment, the transmission line and/or the coupling element is or are arranged on a main surface of the stack or of the component carrier. For instance, transmission line and/or coupling element may be manufactured by patterning a common metal layer on an exterior surface of the stack, for instance a copper foil laminated onto the stack. This may allow to manufacture the transmission line and/or the coupling element with low effort and spatially very close together. This may keep, in turn, a signal transmission path short and guarantees a proper signal quality. Furthermore, manufacturing transmission line and coupling element based on the same metal layer may allow to prevent material or structural bridges and may therefore additionally increase the signal quality.

In an embodiment, the component carrier is configured for transmitting a signal from the high-frequency component via the transmission line, the coupling element and the at least one waveguide to the transmission and/or reception unit for wireless transmission. In such an embodiment, the high-frequency component may be a signal source, wherein a signal generated by the high-frequency component may propagate up to the transmission and/or reception unit for emission to a communication partner device, such as a receiver.

Additionally or alternatively, the component carrier may be configured for wirelessly receiving a signal by the transmission and/or reception unit, and transmitting the received signal via the at least one waveguide, the coupling element and the transmission line to the high-frequency component. In such an embodiment, the high-frequency component may be a signal processor for processing a signal generated by a communication partner device, such as a transmitter, and transmitted to the component carrier for reception by the transmission and/or reception unit.

Again referring to the two previously described embodiments, it is also possible that the component carrier is configured for functioning both as transmitter and as receiver. In such an embodiment, the component carrier may function as a transceiver. The high-frequency component may function both as signal generator for creating a signal to be transmitted and signal processor for processing a received signal. Advantageously, a common signal propagation path may be provided for signal reception and signal transmission, which further increases the level of functionality of the component carrier without increasing its dimensions. Thus, the described construction of the component carrier may enable a bidirectional signal flow, i.e., a common signal flow path for receiving and emitting signals.

In an embodiment, the transmission and/or reception unit is configured for wirelessly transmitting and/or receiving a signal at a main surface of the stack or of the component carrier. In particular, said wirelessly transmitting and/or receiving of a signal may be carried out at a main surface of the stack opposing another main surface of the stack at which the transmission line and the coupling element are formed. When the transmission and/or reception unit is located at a main surface of the component carrier or the stack, low-loss emission and reception of an electromagnetic signal is made possible, since such an electromagnetic signal is not damped by material of the stack. Furthermore, it may be preferred that the main surface of the stack at which the transmission and/or reception unit is arranged opposes another main surface of the stack at which the transmission line and the coupling element are located. Consequently, undesired interactions between, on the one hand, a signal propagating between high-frequency component and coupling element and, on the other hand, a signal emitted and/or received by the transmission and/or reception unit may be reliably prevented. Descriptively speaking, the stack may function for mutually shielding such signals propagating on opposing main surfaces of the component carrier.

In an embodiment, the transmission and/or reception unit is configured for wirelessly transmitting and/or receiving a signal at a sidewall of the stack or of the component carrier. Rather than emitting and/or receiving at or only at a main surface of the stack, such an embodiment may communicate or exchange signals via a sidewall of the stack. This may keep one or both of the main surfaces of the component carrier free for other tasks, for instance for the surface mounting of one or more additional components.

In an embodiment, the component carrier comprises a shielding structure on and/or in the stack and being configured for shielding electromagnetic radiation between the high-frequency component and an environment of the component carrier. Additionally or alternatively, the component carrier comprises a shielding structure on and/or in the stack and being configured for shielding signals between a first main surface of the component carrier at which the transmission line and the coupling element are formed, and the second main surface of the component carrier at which the transmission and/or reception unit is arranged. For example, such a shielding structure may be made of a magnetic material, such as iron or a ferrite. It is however also possible that the shielding structure is made of metal, such as copper. In an embodiment, at least part of the shielding structure is formed by the at least one electrically conductive layer structure of the stack. By providing a shielding structure with the described properties, undesired signal interaction may be prevented and the accuracy of signal transmission and signal processing by the component carrier may be improved.

In an embodiment, the transmission and/or reception unit is configured for wirelessly transmitting and/or receiving a signal via at least one transmission and/or receiving notch. One or more of such notches may be formed in a main surface of the stack for signal transmission and/or reception. For instance, three notches may be appropriate for proper signal transmission or reception. A notch may for example be shaped as a slot.

In an embodiment, the at least one waveguide comprises a first waveguide and a second waveguide. The combination of two waveguides has turned out as particularly advantageous for improving the signal transmission quality. Both waveguides may be integrated in the stack for keeping the component carrier compact and the signal paths short. In yet another embodiment, also three or more waveguides may be used.

In an embodiment, the first waveguide and the second waveguide are coupled by a coupling through hole extending through part of the stack. The dimensions of the coupling through hole may be significantly smaller than the dimensions of the waveguides. For instance, a diameter of the waveguide coupling through hole may be less than 20%, in particular less than 10%, of a diameter of one of the waveguides. As a result, the coupling through hole may be prevented from disturbing signal propagation within a respective one of the waveguides, and may nevertheless ensure a sufficient coupling between the waveguides.

In another embodiment, the first waveguide and the second waveguide are coupled with each other by an aperture in one of the at least one electrically conductive layer structure and/or at least one electrically insulating layer structure of the stack. Thus, a connection hole can also be just an aperture in a plane (such as a copper plane) covering the waveguide. The connection hole can, but does not necessarily have to be a physical hole through the dielectric material of the stack.

In still another embodiment, one of the first waveguide and the second waveguide is a substantially horizontally extending waveguide and the other one is a substantially vertically extending waveguide, wherein the substantially horizontally extending waveguide and the substantially vertically extending waveguide are connected by a bending section. A way to couple the two separate waveguides is to form a bending section, which may bend the waveguide arrangement 90° upwards to point towards the coupling element. In an embodiment, one waveguide is bent 90° upwards.

Furthermore, it may be possible that a waveguide comprises or covers one or more passive structures that can be realized using waveguides (for instance an RF filter, a combiner, a splitter, one or more couplers, etc.) as part of a feeding network between component and antenna (in particular apart from the coupling element).

In another embodiment, the component carrier has only a single waveguide. Such a component carrier may be manufactured with particularly low dimensions.

In an embodiment, at least one of the at least one waveguide is a hollow cavity in the stack, for instance filled with air. In other words, such a waveguide may be a hollow volume in an interior of the stack.

In an embodiment, at least one of the at least one waveguide is filled at least partially with a low DK dielectric solid. A low DK material may have a low real part of the dielectric constant. Since the propagation speed of electromagnetic waves is inversely proportional to the dielectric constant, a low DK value means the wave propagation speed is larger. This provides the advantage that the wave speed is faster. The strength of capacitive coupling is proportional to the dielectric constant so that a low DK material reduces the strength of capacitive crosstalk.

In an embodiment, at least one of the at least one waveguide is at least partially filled with a low DF dielectric solid. A low DF material has a low imaginary part of the dielectric constant. The imaginary part of the dielectric constant determines losses. Filling the mentioned waveguide at least partially with a low DF dielectric solid may keep the losses of the signals small.

For instance, an appropriate low DK and low DF dielectric solid filling of a waveguide may be a ceramic or RO3003™ material, as commercialized by the company Rogers Corporation.

In an embodiment, the component carrier is configured for carrying out a mode conversion between the high-frequency component and the at least one waveguide. More specifically, mode conversion may be accomplished by the coupling element. For instance, the mode conversion converts a mode of the signal between a transverse electromagnetic mode and a transverse electric mode. A transverse mode of electromagnetic radiation may denote a particular electromagnetic field pattern of the electromagnetic radiation in a plane perpendicular (i.e., transverse) to the propagation direction of the electromagnetic radiation. Transverse modes may occur in radio waves confined to the at least one waveguide, and may occur because of boundary conditions imposed on the wave by the waveguide. The mentioned transverse electromagnetic mode may be present at the high-frequency component. Moreover, the transverse electric mode may be present at the at least one waveguide. The described mode conversion may be carried out for reducing losses. The component carrier may be operated with a transverse electric mode.

In an embodiment, the transmission line and the high-frequency component are electrically coupled by at least one vertical through connection embedded in the stack, in particular by at least one metal-filled via. For instance, such a metal-filled via may be manufactured by laser drilling or mechanically drilling a hole in dielectric material of the stack and by subsequently filling the hole with a metal such as copper. This may be accomplished by electroless deposition and/or galvanic plating. Cumbersome wire bonding may thus be dispensable. Also, a copper pillar or the like may be used as vertical through connection. Interconnecting the embedded high-frequency component with a horizontal transmission line may be accomplished with a particularly short path and in a robust way by plated vias. This allows to establish the described electric connection with very little effort and in a mechanically and electrically stable way, being less prone to failure than with a bond wire connection.

In an embodiment, the embedded high-frequency component is fully circumferentially surrounded by material of the stack. This may mechanically protect the tiny high-frequency component and may also provide a proper basis for a shielding of the embedded high-frequency component with regard to surrounding electromagnetic radiation.

In an embodiment, the component carrier is configured as a radar module (in particular in long and midrange radar modules). For instance, a component carrier configured as radar module may be implemented in a car and may capture high-frequency signals when the car travels on a road.

In an embodiment, the electronic device is configured as one of the group consisting of a level sensor device for sensing a filling level in a container, a communication device for wireless data communication with a communication partner device, and an automotive device for assembly in a vehicle, in particular in a car. However, other applications are possible as well.

In an embodiment, at least one electrically insulating layer structure of the stack comprises a high-frequency dielectric. In the context of the present application, the term "high-frequency dielectric" may particularly denote an electrically insulating material which has low-loss properties when a high-frequency or radio-frequency signal propagates in an environment of the high-frequency dielectric. In particular, the high-frequency dielectric may have a lower loss than standard prepreg material of a stack of component carrier material. As an example, RO3003™ material, as commercialized by the company Rogers Corporation, can be used as high-frequency dielectric. For instance, high-frequency dielectric material may have a dissipation factor of not more than 0.005, in particular of not more than 0.003, more particularly not more than 0.0015, at 10 GHz. The mentioned high-frequency circuit materials may be for example ceramic-filled polytetrafluoroethylene (PTFE) composites. By providing at least part of the electrically insulating layer structures of a high-frequency dielectric, a low loss transport of even high-frequency signals is enabled. It is also possible that the high-frequency dielectric is a high-frequency capable prepreg, FR4 or ABF material. Such a high-frequency dielectric material may have a relative permeability, εr, in a range between 1.01 and 4. In a stack, one or more electrically insulating layer structures may be configured as a high-frequency dielectric.

In the following, several processes of embedding a high-frequency component in the layer stack (without or with access to the surface of the layer stack) according to different embodiments will be described.

In one embedding embodiment, the method comprises embedding the component in an opening (such as a through hole) of the stack, wherein the opening is at least temporarily closed at a bottom side by a sticky layer during the embedding. In the context of the present application, the term "sticky layer" may particularly denote a tape, film, foil, sheet, or plate having an adhesive surface. In use, the sticky layer may be used to be adhered to a main surface of a stack for closing an opening extending through the stack. The component may be adhered to the sticky layer for defining a position of the component in the opening and thus relative to the stack. When the sticky layer is removed from the stack before completing manufacture of the component carrier, the sticky layer may be denoted as a temporary carrier. In other embodiments, the sticky layer may however form part of the readily manufactured component carrier. By adhering the component on the sticky tape during the embedding process, the spatial accuracy of the embedding of the component may be excellent. Thus, a compact component carrier with high alignment accuracy may be obtained.

In another embedding embodiment, the method comprises mounting the component on at least one of the layer structures, and thereafter covering the assembled component with further ones of the layer structures, wherein at least one of said further layer structures is provided with an opening accommodating the component. For example, the opening of the respective layer structure may be cut as a through hole into the respective layer structure.

In yet another embedding embodiment, the method comprises embedding a release layer in the layer stack, thereafter forming an opening in the layer stack by removing a piece of the layer stack which piece is delimited at a bottom side by the release layer, and thereafter accommodating the component in the opening. For instance, such a release layer may be made of a material showing poorly adhesive properties with respect to surrounding layer stack material. For instance, an appropriate material for the release layer is polytetrafluoroethylene (PTFE, Teflon®), or a waxy compound. Teflon® is a registered mark of The Chemours Company FC LLC of Wilmington, Delaware U.S.A. For example, the method comprises forming a circumferential cutting trench in the stack extending up to the release layer to thereby separate the piece from a rest of the layer stack. Cutting said trench may be accomplished for example by laser drilling or mechanically drilling.

In yet another embedding embodiment, the method comprises forming an opening in the stack by routing (preferably depth routing), and thereafter accommodating the component on a bottom surface of the routed stack in the opening. Routing is an appropriate and simple mechanism of precisely defining a blind hole-type opening for subsequently accommodating the component.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance, by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance, by laser drilling or mechanical drilling, and by partially or fully filling them with electrically conductive material (in particular copper), thereby forming vias or any other through-hole connections. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photoimageable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the at least one electrically insulating layer structure comprises at least one of the group consisting of a resin or a polymer, such as epoxy resin, cyanate-ester resin, benzocyclobutene resin, bismaleimide-triazine resin, polyphenylene derivate (e.g., based on polyphenylenether, PPE), polyimide (PI), polyamide (PA), liquid crystal polymer (LCP), polytetrafluoroethylene (PTFE) and/or a combination thereof. Reinforcing structures such as webs, fibers, spheres or other kinds of filler particles, for example made of glass (multilayer glass) in order to form a composite, could be used as well. A semi-cured resin in combination with a reinforcing agent, e.g., fibers impregnated with the above-mentioned resins is called prepreg. These prepregs are often named after their properties, e.g., FR4 or FR5, which describe their flame retardant properties. Although prepreg particularly FR4 are usually preferred for rigid PCBs, other materials, in particular epoxy-based build-up materials (such as build-up films) or photoimageable dielectric materials, may be used as well. For high-frequency applications, high-frequency materials such as polytetrafluoroethylene, liquid crystal polymer and/or cyanate ester resins, may be preferred. Besides these polymers, low-temperature cofired ceramics (LTCC) or other low, very low or ultra-low DK materials may be applied in the component carrier as electrically insulating structures.

In an embodiment, the at least one electrically conductive layer structure comprises at least one of the group consisting of copper, aluminum, nickel, silver, gold, palladium, tungsten and magnesium. Although copper is usually preferred, other materials or coated versions thereof are possible as well, in particular coated with supra-conductive material or conductive polymers, such as graphene or poly(3,4-ethylenedioxythiophene) (PEDOT), respectively.

At least one further component may be embedded in and/or surface mounted on the stack. The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. An inlay can be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminum oxide ($Al_2O_3$) or aluminum nitride (AlN). In order to increase the heat exchange capacity, other geometries with increased surface area are frequently used as well. Furthermore, a component can be an active electronic component (having at least one p-n-junction implemented), a passive electronic component such as a resistor, an inductance, or capacitor, an electronic chip, a storage device (for instance a DRAM or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semiconductor materials such as silicon carbide (SiC), gallium arsenide (GaAs), gallium nitride (GaN), gallium oxide ($Ga_2O_3$), indium gallium arsenide (InGaAs) and/or any other suitable inorganic compound), an optoelectronic interface element, a light-emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be an IC substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electro-magnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Immersion Palladium Immersion Gold (ENIPIG), gold (in particular hard gold), chemical tin, nickel-gold, nickel-palladium, etc.

The aspects defined above and further aspects are apparent from the examples of embodiment to be described hereinafter and are explained with reference to these examples of embodiment.

DETAILED DESCRIPTION OF ILLUSTRATED EMBODIMENTS

Figure 1:
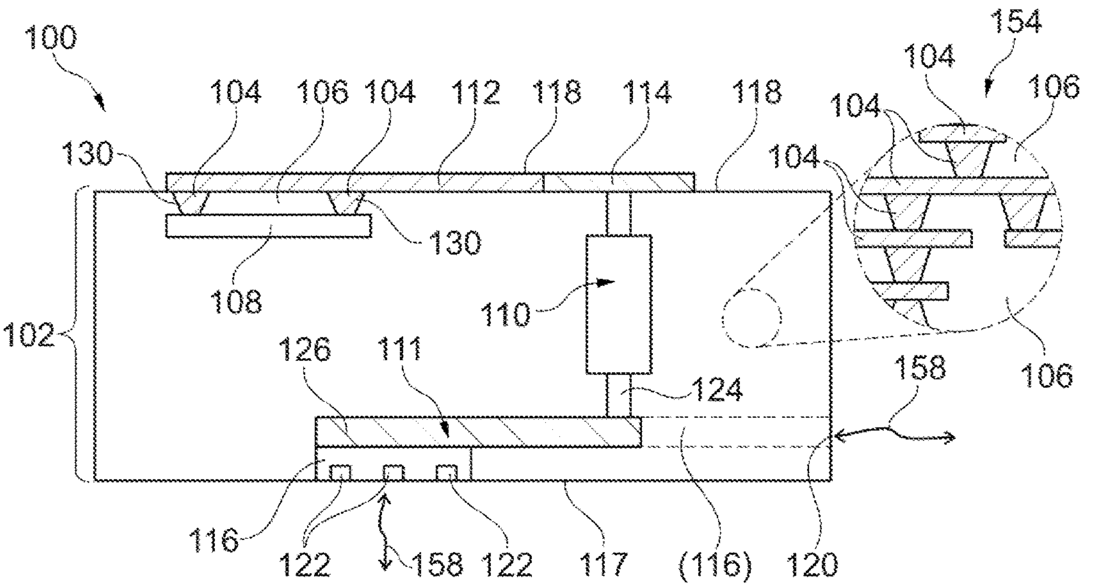
FIG. 1 illustrates a schematic cross-sectional view of a component carrier according to an exemplary embodiment.

The illustrations in the drawings are schematically presented. In different drawings, similar or identical elements are provided with the same reference signs.

Before referring to the drawings, exemplary embodiments will be described in further detail, some basic considerations will be summarized based on which exemplary embodiments of the invention have been developed.

Conventionally, high-frequency devices have been built with a front-end module utilizing a substrate with waveguide. A plurality of separate printed circuit boards, each comprising surface mounted constituents, have then been soldered together. Such conventional approaches require a high space consumption, are bulky and suffer from poor signal transmission quality.

According to an exemplary embodiment of the invention, a high-frequency component (such as an RFIC) can be embedded in a component carrier (such as a printed circuit board, PCB) in combination with one or more embedded waveguides to form a self-packaged component carrier. The embedded high-frequency component may be functionally coupled with the integrated waveguide(s) by a transmission line and a coupling element, and electromagnetic signals may be wirelessly transmitted and/or received by a transmission and/or reception unit of the component carrier. Hence, all mentioned constituents may be integrated in a single component carrier in a space-saving configuration and with excellent signal transmission quality.

Although multiple applications of such a component carrier are possible, an exemplary application of exemplary embodiments of the invention relates to an automotive radar module. A further application of exemplary embodiments of the invention is a device operating in accordance with a 60 GHz wireless network protocol, also denoted as 60 GHz Wi-Fi or WiGig.

Descriptively speaking, an exemplary embodiment of the invention provides a PCB-type component carrier that fulfills a comparable functionality as the three above mentioned PCBs with significantly smaller space consumption and significantly improved transmission quality. Since soldering or comparable connection techniques may be dispensable according to exemplary embodiments of the invention and since multiple PCBs may be combined in one single component carrier, signal losses may be strongly suppressed. Moreover, a (for instance air filled) waveguide embedded in the stack of the component carrier offers a better signal performance than conventional approaches. Also, PCB-packaged waveguide antennas may contribute to the excellent signal performance of a component carrier according to an exemplary embodiment of the invention.

Hence, an exemplary embodiment combines conventionally separate PCBs into one while offering better signal performance, in particular by integrating an empty (i.e., air filled) substrate-integrated waveguide (SIW). Furthermore, a high-frequency component (in particular a front-end RFIC) may be embedded in the same core or stack of the component carrier to offer excellent RF performance.

A gist of an exemplary embodiment is to embed a whole radar front-end into one printed circuit board in order to circumvent the need for at least one additional separate PCB assembly and to offer a highly efficient and low-loss antenna.

In automotive radar systems, high-performance antennas may be desired in order to offer high reliability, high efficiency of the overall system and low power consumption. According to an exemplary embodiment of the invention, one or more high-frequency components (such as RFIC chips) and a feeding network to the waveguide-based antennas can all be integrated in one PCB, rather than relying on separately build-up PCBs which are then soldered together.

In one embodiment, a component carrier with an air-filled substrate embedded waveguide may be provided. In another embodiment, a component carrier may be equipped with a substrate integrated waveguide, which is particularly simply in manufacture. Both configurations offer a high performance. The one or more high-frequency components may be embedded in the stack of the component carrier to obtain a compact configuration, rather than being surface mounted in a bulky fashion.

In one embodiment, the at least one waveguide may be a PCB embedded air-filled waveguide.

However, in one embodiment the at least one waveguide may be a substrate integrated waveguide (SIW). The term "substrate-integrated waveguide (SIW)" specifies a structure that enables a waveguide like propagation mode. The sidewalls for an SIW may be not continuous metal walls, but they may be formed by plated through holes and/or vias. The density of such a via fence may yield a maximum operational frequency of the SIW, and the propagation mode may be different from other types of waveguides.

In particular, an RFIC-type high-frequency component may be embedded in a PCB-type layer stack. It may then be possible to feed the substrate integrated waveguide (which may be optionally air-filled) through a cutout in the layer stack with a microstrip antenna. The substrate integrated waveguide may be advantageously formed with a high-frequency dielectric having a low DF value as its base, while an air-filled substrate embedded waveguide can be formed with a simple FR4 dielectric. By taking this measure, a proper alignment between the different parts of the overall PCB-type component carrier may be obtained.

In particular, a self-packaged automotive radar module with excellent signal performance may be obtained. By embedding a high-frequency component in a laminated layer stack rather than soldering a high-frequency component in a surface mounted fashion, RF performance may be significantly improved by avoiding the negative influence of solder balls on the transition resistance. Furthermore, a waveguide (such as at least one substrate integrated waveguide) may be implemented according to exemplary embodiments of the invention and may show a significant performance improvement compared to standard PCB transmission modes. Embedding an integrated waveguide in the stack of the component carrier according to an exemplary embodiment of the invention may also reduce the manufacturing effort for the passive RF circuit compared to an externally assembled waveguide. Preferably, the high-frequency component (in particular an RFIC) and the waveguide may be embedded on top of each other which saves space in a lateral direction.

Hence, a component carrier according to an exemplary embodiment of the invention implements an embedded RF front-end with an integrated RFIC inside the PCB. Such a configuration may be particularly advantageous for automotive applications, but is not limited to it.

FIG. 1 illustrates a schematic cross-sectional view of a component carrier 100 according to an exemplary embodiment of the invention.

Component carrier 100 according to FIG. 1 may be configured as a plate-shaped laminate-type printed circuit board (PCB). Thus, the component carrier 100 shown in FIG. 1 may be highly compact in a vertical direction. More specifically, the component carrier 100 may comprise a laminated layer stack 102 of electrically conductive layer structures 104 and electrically insulating layer structures 106 (see detail 154 in FIG. 1). Again referring to detail 154 in FIG. 1, the electrically conductive layer structures 104 may comprise patterned or continuous copper foils and vertical through connections, for example copper filled laser vias which may be created by plating. The electrically insulating layer structures 106 may comprise a respective resin (such as a respective epoxy resin), preferably comprising reinforcing particles therein (for instance glass fibers or glass spheres). For instance, the electrically insulating layer structures 106 may be made of prepreg or FR4.

Moreover, the component carrier 100 comprises a high-frequency component 108 embedded in the stack 102. This promotes compactness of the design of the component carrier 100. In the shown embodiment, the embedded high-frequency component 108 is fully circumferentially surrounded by material of the stack 102 and is thus properly mechanically protected. Also, creation of a shielding (not shown, for instance, a magnetic cage or a metallic cage surrounding at least part of the high-frequency component 108) of the high-frequency component 108 with respect to electromagnetic stray radiation from the environment is easily possible when the high-frequency component 108 is fully circumferentially embedded in the stack 102. Although not shown in FIG. 1, one or more further high-frequency components 108 may be embedded in the stack as well (for instance, one or more further RFICs, radio-frequency integrated circuits). This may allow to further extend the electronic functionality of the component carrier 100. For instance, the high-frequency component 108 may comprise front end circuitry. The high-frequency component 108 may for instance be embodied as a semiconductor chip, which may be a naked die or a packaged chip.

Furthermore, a first waveguide 110 (which may be embodied as a cavity in stack 102, for instance filled with air or with a low DF and/or low DK dielectric) and a second waveguide 111 (which may be embodied as a cavity in stack 102, for instance filled with air or with a low DF and/or low DK dielectric) are formed or integrated in an interior of the stack 102. This promotes compactness of the design of the component carrier 100. The illustrated waveguide design may provide a highly accurate signal transmission with low RF losses. As shown, the first waveguide 110 and the second waveguide 111 are efficiently coupled by a narrow coupling through hole 124 (which may be denoted as a hollow coupling neck) extending vertically through part of the stack 102.

Although not shown, the first waveguide 110 and the second waveguide 111 may also be coupled with each other by an aperture in a layer of the stack 102. It is also possible that one of the first waveguide 110 and the second waveguide 111 is a substantially horizontally extending waveguide and the other one is a substantially vertically extending waveguide, wherein the substantially horizontally extending waveguide and the substantially vertically extending waveguide are connected by a 90° bending section.

In the shown embodiment, the first waveguide 110 is filled with air. Moreover, the second waveguide 111 may be filled with a low DF and/or low DK dielectric solid 126, such as a ceramic or RO3003™ material, as commercialized by the company Rogers Corporation. Both designs may keep the losses small.

Beyond this, a transmission line 112 and a coupling element 114 (preferably, but not necessarily embodied as a coupling antenna) are formed, preferably as a common patterned metal layer, on a main surface 118 of the stack 102. This may keep the signal path between component 108 and waveguide 110 short. As shown, both the transmission line 112 and the coupling element 114 are arranged on the upper main surface 118 of the stack 102. The transmission line 112 may be embodied as a stripline which may be connected to vertical through connections 130, here embodied as copper filled laser vias. The vertical through connections 130, in turn, may be connected to pads of the high-frequency component 108. Hence, the transmission line 112 and the high-frequency component 108 may be electrically coupled by the vertical through connections 130 embedded in the stack 102 and embodied as metal-filled vias.

The coupling element 114 may be configured for irradiating an electromagnetic signal, which is based on an electric signal propagating along the transmission line 112, into the first waveguide 110. Thus, the combination of transmission line 112 and coupling element 114 is configured for efficiently transmitting a signal between the high-frequency component 108 and the first waveguide 110.

Moreover, a transmission and/or reception unit 116 is provided which is coupled with the waveguides 110, 111. In the shown embodiment, the transmission and/or reception unit 116 is formed at a lower main surface 117 of the component carrier 100 opposing the upper main surface 118 of the component carrier 100 at which the transmission line 112 and the coupling element 114 are formed. The transmission and/or reception unit 116 may be configured for wirelessly transmitting a signal to a communication partner device (not shown) and/or for receiving a signal from a communication partner device (not shown). In the shown embodiment, the component carrier 100 is configured for transmitting a signal from the high-frequency component 108 via the transmission line 112, the coupling element 114 and the waveguides 110, 111 to the transmission and/or reception unit 116 for wireless transmission. Furthermore, the component carrier 100 may be configured for wirelessly receiving a signal (in particular electromagnetic radiation signals 158) by the transmission and/or reception unit 116, and transmitting the received signal via the waveguides 110, 111, the coupling element 114 and the transmission line 112 to the high-frequency component 108. Thus, the described signal path between high-frequency component 108 and transmission and/or reception unit 116 may be bidirectional, so that the transmission and/or reception unit 116 can be denoted as a transceiver unit. In another embodiment, also a unidirectional communication path is possible. Advantageously, the transmission and/or reception unit 116 may be configured for wirelessly transmitting and/or receiving a signal via a number of (in the shown embodiment three) trans-mission and/or receiving notches 122 formed in the lower main surface 117.

Spatially separating the signal transmission between coupling element 114 and first waveguide 110 on the one hand and wireless signal transmission by transmission and/or reception unit 116 on the other hand on opposing main surfaces 117, 118 of the stack 102 may efficiently prevent an undesired interaction between the signals and increases signal quality.

As indicated in FIG. 1 as well, the transmission and/or reception unit 116 may be additionally or alternatively configured for wirelessly transmitting and/or receiving a signal at a sidewall 120 of the component carrier 100. This keeps the lower main surface 117 free for other tasks, such as surface mounting further components (not shown).

The coupling element 114 of the component carrier 100 may be configured for carrying out a mode conversion between the high-frequency component 108 and the waveguides 110, 111. This may reduce RF losses. Said mode conversion may convert a mode of the signal between a transverse electromagnetic mode and a transverse electric mode. More specifically, the mentioned transverse electromagnetic mode may be present at the high-frequency component 108, whereas the transverse electric mode may be present at the waveguides 110, 111.

For example, the component carrier 100 is configured as a radar mod-ule for an automotive application.

Figure 2:
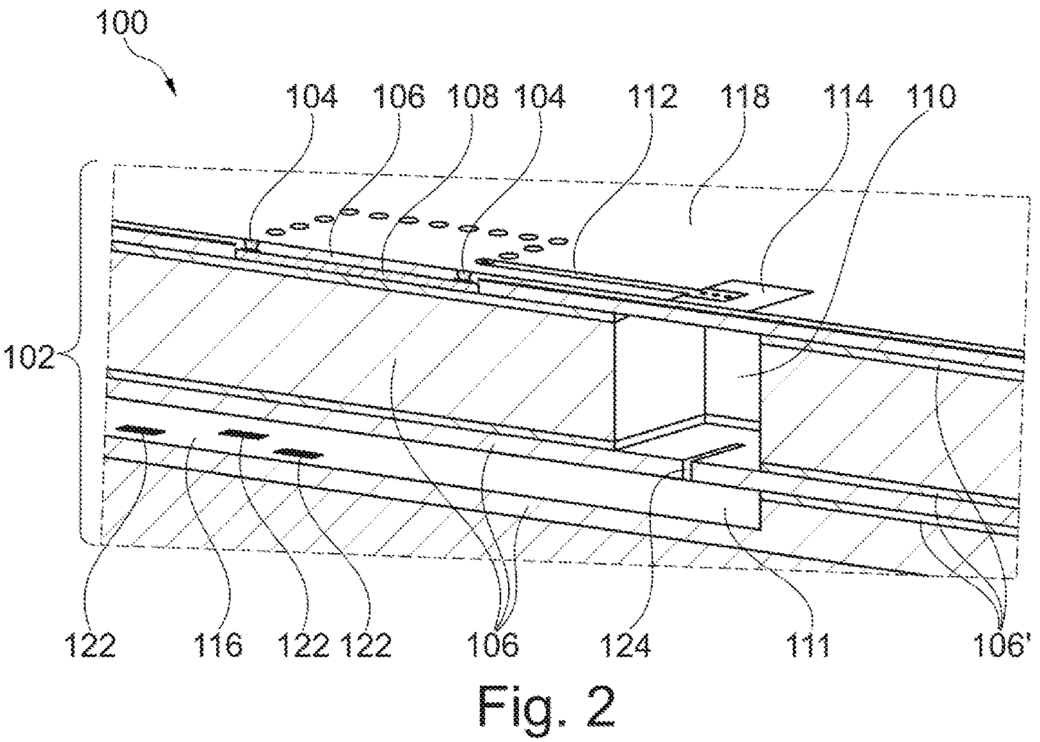
FIG. 2 illustrates a three-dimensional cross-sectional view of a component carrier according to another exemplary embodiment.
Figure 3:
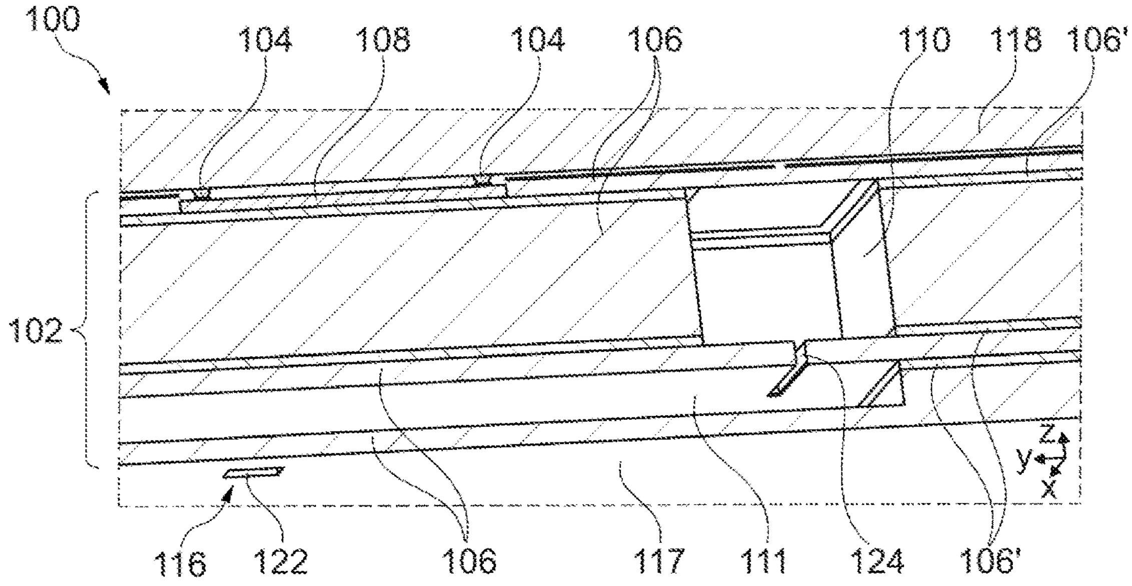
FIG. 3 illustrates another three-dimensional cross-sectional view of the component carrier according to FIG. 2.

FIG. 2 illustrates a three-dimensional cross-sectional view of a component carrier 100 according to another exemplary embodiment of the invention. FIG. 3 illustrates another three-dimensional cross-sectional view of the component carrier 100 according to FIG. 2. FIG. 2 and FIG. 3 show cross-sectional views of waveguides 110, 111. For instance, both waveguides 110, 111 may be air filled cavities. Shape and dimensions of the waveguides 110, 111 may be selected in accordance with a desired frequency and/or a desired mode. Electrically insulating layer structures 106 may be made of prepreg. Advantageously, only electrically insulating layer structures 106' may be made of high-frequency dielectric. By taking this measure, the higher effort involved with high-frequency dielectrics may be limited to regions of the component carrier 100 where they are of utmost advantage, such as at a bottom of waveguide 110. All other dielectrics may be ordinary prepreg which may be provided with lower effort.

Figure 4:
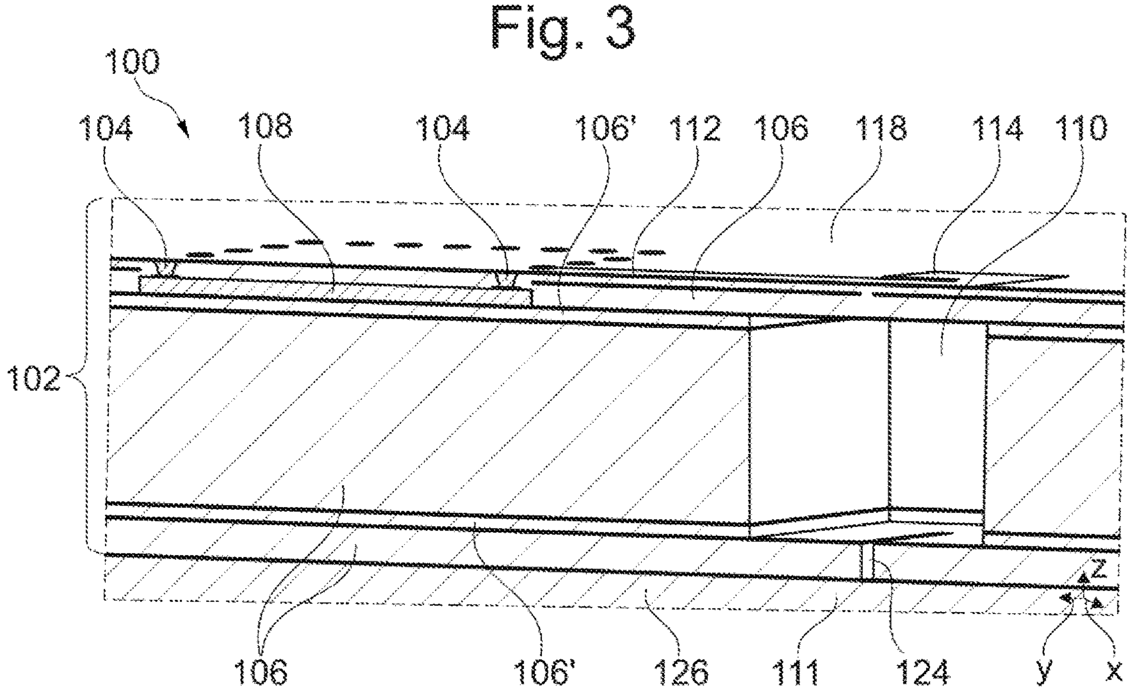
FIG. 4 illustrates a three-dimensional cross-sectional view of a component carrier according to still another exemplary embodiment.

FIG. 4 illustrates a three-dimensional cross-sectional view of a component carrier 100 according to still another exemplary embodiment of the invention. FIG. 4 show a cross-sectional view of waveguides 110, 111 with SIW. For instance, waveguide 110 may be an air-filled cavity, whereas waveguide 111 may be filled with a low DF and/or low DK dielectric.

The feature according to reference sign 124 does not necessarily have to be a real physical hole, as shown in FIG. 4. In another embodiment, it can also be an aperture in a ground plane.

Figure 5:
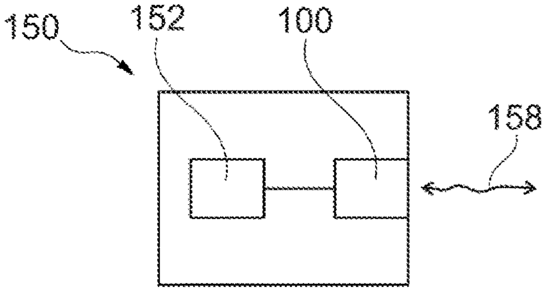
FIG. 5 illustrates an electronic device comprising a component carrier according to an exemplary embodiment.

FIG. 5 illustrates an electronic device 150 comprising a component carrier 100 according to an exemplary embodiment of the invention.

The electronic device 150 comprises a component carrier 100 according to FIG. 1 to FIG. 4. For instance, the electronic device 150 is configured as a level sensor device for sensing a filling level in a container, a communication device for wireless data communication with a communication partner device, an automotive device for assembly in a car, etc. Furthermore, the electronic device 150 may comprise a processor 152 which is coupled with the component carrier 100, for instance for controlling the component carrier 100 and/or for being controlled by the component carrier 100. By the component carrier 100, electromagnetic radiation signals 158 may be emitted and/or received.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:

a stack comprising several electrically conductive layer structures and several electrically insulating layer structures, wherein at least two electrically conductive layer structures are connected to one another by at least one via;

a high-frequency component embedded in the stack;

at least one waveguide integrated in the stack;

a transmission line and a coupling element configured for transmitting a signal between the high-frequency component and the at least one waveguide; and a transmission and/or reception unit coupled with the at least one waveguide through the stack and configured for wirelessly transmitting and/or receiving a signal;

wherein the transmission line is located on one main surface of the stack and the transmission and/or reception unit is formed within the stack at an opposed main surface of the stack;

wherein the at least one waveguide comprises a first waveguide and a second waveguide, wherein the first waveguide and the second waveguide are coupled with each other by a coupling through hole, the coupling through hole directly connecting the first waveguide and directly connecting the second waveguide and extending through part of the stack;

wherein at least one of the at least one waveguide is a hollow cavity in the stack and defined by inner sidewalls of the electrically insulating layer structures of the stack.

2. The component carrier according to claim 1, wherein the coupling element is arranged on a main surface of the stack.

3. The component carrier according to claim 1, wherein the component carrier is configured for transmitting a signal from the high-frequency component via the transmission line, the coupling element and the at least one waveguide to the transmission and/or reception unit for wireless transmission.

4. The component carrier according to claim 1, wherein the component carrier is configured for wirelessly receiving a signal by the transmission and/or reception unit and transmitting the received signal via the at least one waveguide, the coupling element, and the transmission line to the high-frequency component.

5. The component carrier according to claim 1, wherein the transmission and/or reception unit is configured for wirelessly transmitting and/or receiving a signal at a main surface of the stack opposing another main surface of the stack at which the transmission line and the coupling element are formed.

6. The component carrier according to claim 1, wherein the transmission and/or reception unit is configured for wirelessly transmitting and/or receiving a signal at a sidewall of the stack.

7. The component carrier according to claim 1, wherein the transmission and/or reception unit is configured for wirelessly transmitting and/or receiving a signal via at least one transmission and/or receiving notch in a surface of the stack.

8. The component carrier according to claim 1, wherein the coupling through hole comprises an aperture in one of the at least one electrically conductive layer structure and/or one of the electrically insulating layer structures of the stack.

9. The component carrier according to claim 1, wherein one of the first waveguide and the second waveguide is a substantially horizontally extending waveguide and the other waveguide is a substantially vertically extending waveguide, and wherein the substantially horizontally extending waveguide and the substantially vertically extending waveguide are connected by a bending section.

10. The component carrier according to claim 1, wherein at least one of the at least one waveguide is filled with air.

11. The component carrier according to claim 1, wherein at least one of the at least one waveguide is at least partially filled with a low dissipation factor dielectric solid.

12. The component carrier according to claim 1, wherein the component carrier is configured for carrying out a mode conversion between the high-frequency component and the at least one waveguide.

13. The component carrier according to claim 1, wherein the stack comprises three interconnected cores;

wherein the transmission line and the high-frequency component are electrically coupled by at least one vertical through connection embedded in the stack.

14. The component carrier according to claim 1, comprising at least one of the following features:

wherein the embedded high-frequency component is fully circumferentially surrounded by material of the stack;

wherein the component carrier is configured as a radar module;

wherein the coupling element is a coupling antenna.

15. An electronic device, comprising:

a component carrier having a stack;

a high-frequency component;

at least one waveguide;

a transmission line;

a coupling element; and a transmission unit and/or a reception unit, the stack comprising electrically conductive layer structures and electrically insulating layer structures, wherein at least two electrically conductive layer structures are connected to one another by at least one via, the high-frequency component embedded in the stack, the at least one waveguide integrated in the stack, the transmission line and the coupling element configured for transmitting a signal between the high-frequency component and the at least one waveguide, the transmission and/or the reception unit coupled with the at least one waveguide through the stack and configured for wirelessly transmitting and/or receiving a signal;

wherein the transmission line is located on one main surface of the stack and the transmission and/or reception unit is formed within the stack at an opposed main surface of the stack;

wherein the at least one waveguide comprises a first waveguide and a second waveguide, wherein the first waveguide and the second waveguide are coupled with each other by a coupling through hole, the coupling through hole directly connecting the first waveguide and directly connecting the second waveguide and extending through part of the stack;

wherein at least one of the at least one waveguide is a hollow cavity in the stack and defined by inner sidewalls of the electrically insulating layer structures of the stack.

16. The electronic device according to claim 15, configured as one of the group consisting of a level sensor device for sensing a filling level in a container, a communication device for wireless data communication with a communication partner device, and an automotive device configured for assembly in a vehicle.

17. A method of manufacturing a component carrier, comprising:

providing a stack comprising several electrically conductive layer structures and several electrically insulating layer structures, wherein at least two electrically conductive layer structures are connected to one another by at least one via;

embedding a high-frequency component in the stack;

integrating at least one waveguide in the stack;

forming a transmission line and a coupling element for transmitting a signal between the high-frequency component and the at least one waveguide; and forming a transmission and/or reception unit coupled with the at least one waveguide through the stack and configured for wirelessly transmitting and/or receiving a signal;

wherein the transmission line is located on one main surface of the stack and the transmission and/or reception unit is formed within the stack at an opposed main surface of the stack;

wherein the at least one waveguide comprises a first waveguide and a second waveguide, wherein the first waveguide and the second waveguide are coupled with each other by a coupling through hole, the coupling through hole directly connecting the first waveguide and directly connecting the second waveguide and extending through part of the stack;

wherein at least one of the at least one waveguide is a hollow cavity in the stack and defined by inner sidewalls of the electrically insulating layer structures of the stack.

* * * * *